United States Patent [19]
Sasaki et al.

[11] Patent Number: 5,146,427
[45] Date of Patent: Sep. 8, 1992

[54] HIGH SPEED SEMICONDUCTOR MEMORY HAVING A DIRECT-BYPASS SIGNAL PATH

[75] Inventors: Katsuro Sasaki, Fuchu; Nobuyuki Moriwaki, Kodaira; Shigeru Honjo, Otsuki; Hideaki Nakamura, Kodaira, all of Japan

[73] Assignees: Hitachi Ltd., Tokyo; Hitachi Vlsi Engineering Corp., Kodaira, both of Japan

[21] Appl. No.: 825,782

[22] Filed: Jan. 21, 1992

Related U.S. Application Data

[63] Continuation of Ser. No. 567,099, Aug. 14, 1990, abandoned.

[30] Foreign Application Priority Data

Aug. 30, 1989 [JP] Japan .................................. 1-221456

[51] Int. Cl.$^5$ .......................... G11C 7/00; G11C 8/00
[52] U.S. Cl. ............................... 365/189.05; 365/190; 365/233
[58] Field of Search ............... 365/189.01, 189.05, 365/190, 205, 207, 208, 230.08, 233; 307/530

[56] References Cited

U.S. PATENT DOCUMENTS

| | | | |
|---|---|---|---|
| 4,253,163 | 2/1981 | Komoriya et al. | 365/207 |
| 4,766,572 | 8/1988 | Kobayashi | 365/189.05 |
| 4,811,295 | 3/1989 | Shinoda | 365/189.05 |
| 4,858,188 | 8/1989 | Kobayashi | 365/189.05 |
| 4,881,203 | 11/1989 | Watanabe et al. | 365/189.05 |
| 4,891,792 | 1/1990 | Hanamura et al. | 365/189.05 |
| 5,023,841 | 6/1991 | Akrout et al. | 365/189.05 |
| 5,051,955 | 9/1991 | Kobayashi | 365/190 |

FOREIGN PATENT DOCUMENTS 105389 4/1989 Japan .

OTHER PUBLICATIONS

Minato et al, "A 42ns 1Mb CMOS SRAM", IEEE-ISSC '87 (Feb. 27, 1987), Dig. of Techical Papers.

Yamamoto et al, "A 256K CMOS SRAM with Variable-Impedance Loads", IEEE-ISSC '85 (Feb. 13, 1985), Dig. of Technical Papers.

Primary Examiner—Stuart N. Hecker
Assistant Examiner—Jack A. Lane
Attorney, Agent, or Firm—Antonelli, Terry, Stout & Kraus

[57] ABSTRACT

In a semiconductor memory, a latch circuit is arranged between the outputs of a sense amplifier and the inputs of a data output buffer. First pass-gates are arranged between the outputs of the sense amplifier and the latch circuit, while second pass-gates are arranged between the latch circuit and the inputs of the data output buffer. The outputs of the sense amplifier are transmitted to the inputs of the data output buffer through signal paths which bypass the first pass-gates, the latch circuit and the second pass-gates, whereby the data output buffer generates a data output quickly. Thereafter, the first pass-gates and the second pass-gates are controllably brought to a signal-through condition, whereby the output information items of the sense amplifier are stored in the latch circuit. The data output buffer holds the data output in conformity with the stored information items of the latch circuit. For a period of time for which the data output buffer holds the data output, the sense amplifier is held in a non-activated condition, so that the power consumption of the semiconductor memory is lowered.

10 Claims, 5 Drawing Sheets

HIGH SPEED SEMICONDUCTOR MEMORY HAVING A DIRECT-BYPASS SIGNAL PATH

This application is a continuation of application Ser. No. 07/567,099, filed on Aug. 14, 1990, now abandoned.

BACKGROUND OF THE INVENTION

1. Field of the Invention

The present invention relates to a semiconductor integrated circuit device such as static type random access memory circuit device.

2. Description of the Prior Art

As stated in 1987 ISSCC (IEEE International Solid-State Circuits Conference) Digest of Technical Papers, pp. 260–261, and 1985 ISSCC Digest of Technical Papers, pp. 58–59, a memory circuit device in the prior art recovers a potential level chop of a bit line after the writing of memory cell information, in such a way in which an n-channel MOS transistor which is the load of the bit line (or a data line) is controlled into its conductive or non-conductive state by a $\overline{WE}$ signal which is the inverted signal of a write enable signal or a pulse signal which is produced from the $\overline{WE}$ signal.

Figure 4:
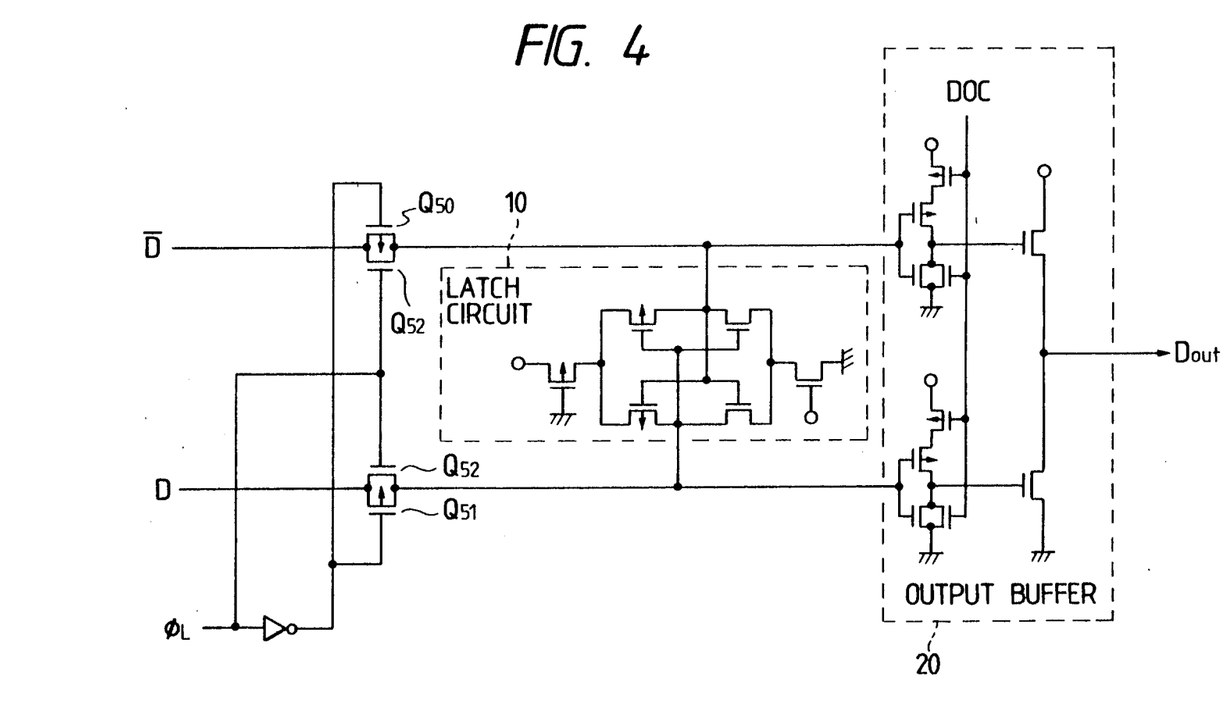
FIG. 4 is a circuit diagram showing a prior-art technique.

In another memory circuit device in the prior art, as illustrated in FIG. 4, transfer gate MOS transistors $Q_{50}$–$Q_{52}$ are brought into their conductive states by a signal $\phi_L$, thereby to transmit sense amplifier complementary output data D, $\overline{D}$ to a latch circuit 10 and an output buffer 20.

SUMMARY OF THE INVENTION

With the prior-art latch system in FIG. 4, for the purpose of inverting the latch information of the latch circuit 10 by the use of the data bus signals D, $\overline{D}$, the pass-gates (CMOS transmission or CMOS transfer gates $Q_{50}$–$Q_{52}$ should become to be enabled after a sufficient potential difference has developed between the data bus complementary signals D, $\overline{D}$. That is, the pass-gates $Q_{50}$–$Q_{52}$ should not become enabled until the input information (sense amplifier output signals) of the data bus signals D, $\overline{D}$ has exceeded the stored information stored in the latch circuit 10. The present inventors, after carefully studying such circuitry, have determined that if the pass-gates $Q_{50}$–$Q_{52}$ are not timely enabled the input information of data buses might be destroyed by the stored information Moreover, with the prior-art latch system in FIG. 4, when the latch information is inverted after enabling the pass-gates $Q_{50}$–$Q_{52}$, the potential difference of the data bus signals D, $\overline{D}$ decreases temporarily by virtue of the influence of the previously stored information on the new inverting information. The present inventors have also determined that, for this reason, the arrival of the data bus signals at the output buffer 20 lags i.e., becomes delayed, to pose the problem of a delay in an access time.

Regarding the prior-art technique stated in both of the above-mentioned technical bulletins, the inventors' study has revealed that, when the capacitance of the bit line increases as a result of an increase in the density of integration of the memory, a long time is expended on the recovery of the potential level of the bit line after writing the memory cell information, to pose the problem of the delay of an access time or the destruction of the memory cell information.

It is accordingly an object of the present invention to shorten the delay of an access time attributed to the presence of a latch circuit installed on data buses for transmitting the output signals of a sense amplifier to an output buffer.

Another object of the present invention is to quickly recover the potential level of a bit line after writing memory cell information, thereby to shorten the delay of an access time.

According to a typical aspect of performance of the present invention, paths are laid in order that the signals of data buses to which sense amplifier outputs of a preceding stage (or first sense amplifier) are transmitted may be transmitted to the inputs of a succeeding circuit (including an output buffer and a third stage sense amplifier or second sense amplifier) while bypass a latch circuit. In addition, pass-gates are arranged between the inputs of the latch circuit and the data buses to which the first sense amplifier outputs are transmitted, while pass-gates are arranged between the outputs of the latch circuit and the inputs of the succeeding circuit. Accordingly, the latch circuit is connected with the data buses, the bypass signal paths, or the inputs of the succeeding circuit through the input side pass-gates as well as the output side pass-gates. Besides, CMOS inverters which are unidirectional signal transmission circuits for transmitting signals from inputs to outputs are interposed between the latch circuit and the output side pass-gates, whereby the outputs of the latch circuit are amplified, and noise is prevented from being erroneously written from the output side pass-gates into the latch circuit.

According to a preferred aspect of performance of the present invention, MOS transistors are connected between bit lines b, $\overline{b}$, whereby the MOS transistors are turned "on" by a pulse signal generated at the rising edge of a write signal $\overline{WE}$. Thus, current flows from the bit line of high potential to the bit line of low potential, so that the potential of the low-potential bit line rises rapidly. Therefore, the delay of an access time is shortened at a change from a write cycle to a read cycle.

Owing to the above, the output signals of a sense amplifier transmitted to the data buses are transmitted to the output buffer or the third stage sense amplifier while circumventing the latch circuit. Further, after the readout information items of a memory cell from the sense amplifier have been transmitted to the output buffer or the third stage sense amplifier through the data buses, they are written into the latch circuit through the input side pass-gates under signal-through conditions. Thereafter, the stored information items of the latch circuit are transmitted to the output buffer or the third stage sense amplifier through the output side pass-gates under signal-through conditions.

After this point of time, the potentials of the output buffer or the third stage sense amplifier are settled by the stored information items of the latch circuit. Therefore, a front stage sense amplifier and the second stage sense amplifier for amplifying the readout information items from the memory cell and transmitting them to the data buses can be controlled into non-activated conditions or low gain—low power consumption operating states, and the power consumption of the whole semiconductor integrated circuit device can be sharply lowered.

Moreover, since the readout information items of the memory cell are transmitted early to the output buffer or the third stage sense amplifier through the paths circumventing the latch circuit, the delay of an access time attributed to the installation of the latch circuit can be shortened.

Furthermore, the MOS transistors connected between the bit lines b, b̄ are turned "on" by the pulse signal $\phi_{WREQ}$ generated at the rising edge of the write signal $\overline{WE}$, thereby permitting the current to flow from the high-potential bit line to the low-potential bit line. Consequently, the potential of the low-potential bit line rises rapidly, so that the delay of the access time is shortened at the change from the write cycle to the read cycle.

The other objects and features of the present invention will become apparent from the description of embodiments.

DESCRIPTION OF THE PREFERRED EMBODIMENT

Circuit Arrangement of Embodiment

Now, one embodiment of the present invention will be described with reference to FIGS. 1(A) and 1(B).

Figure 1A:
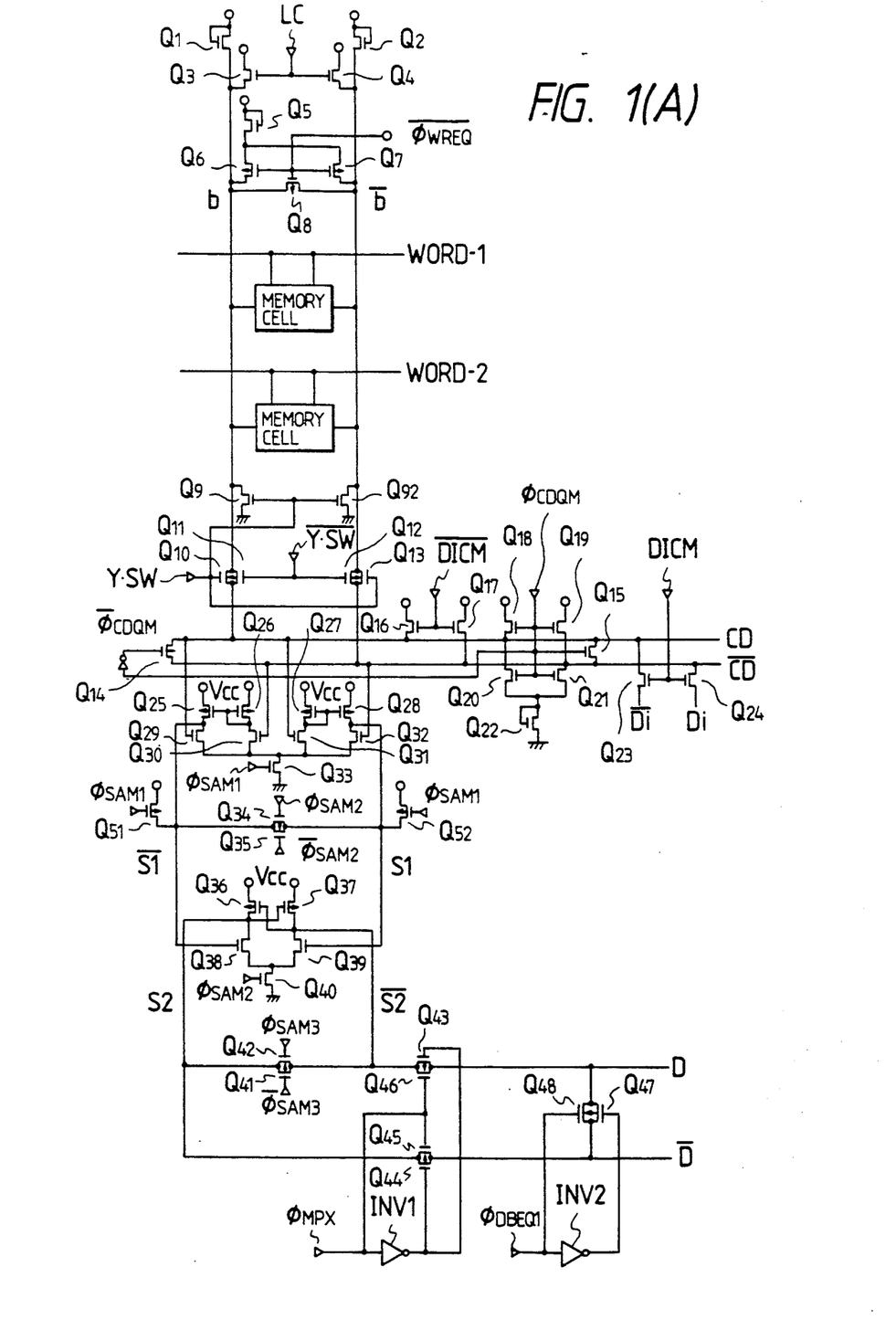
FIGS. 1(A) and 1(B) are circuit diagrams showing an embodiment of the present invention.

In FIG. 1(A), a plurality of memory cells are those of an SRAM (static type random access memory). When either of word selection lines WORD-1, WORD-2 is set at a "1" level (selection level), complementary readout signals are read out of the selected memory cell onto a pair of bit lines b, b̄.

N-channel MOS transistors $Q_1$, $Q_2$, $Q_3$, $Q_4$, $Q_5$ and p-channel MOS transistors $Q_6$, $Q_7$, $Q_8$ are the loads of the pair of bit lines b, b̄. In a write cycle, a signal LC is set at a "0" level, while a signal $\phi_{WREQ}$ is set at the "1" level Therefore, the n-channel MOS transistors $Q_3$, $Q_4$ are turned "off", and the p-channel MOS transistors $Q_6$, $Q_7$, $Q_8$ are also turned "off". Accordingly, the bit line load MOS transistors which are turned "on" are only the transistors $Q_1$, $Q_2$, so that current to flow into the bit line into which the "0" level is to be written can be decreased.

Figure 2:
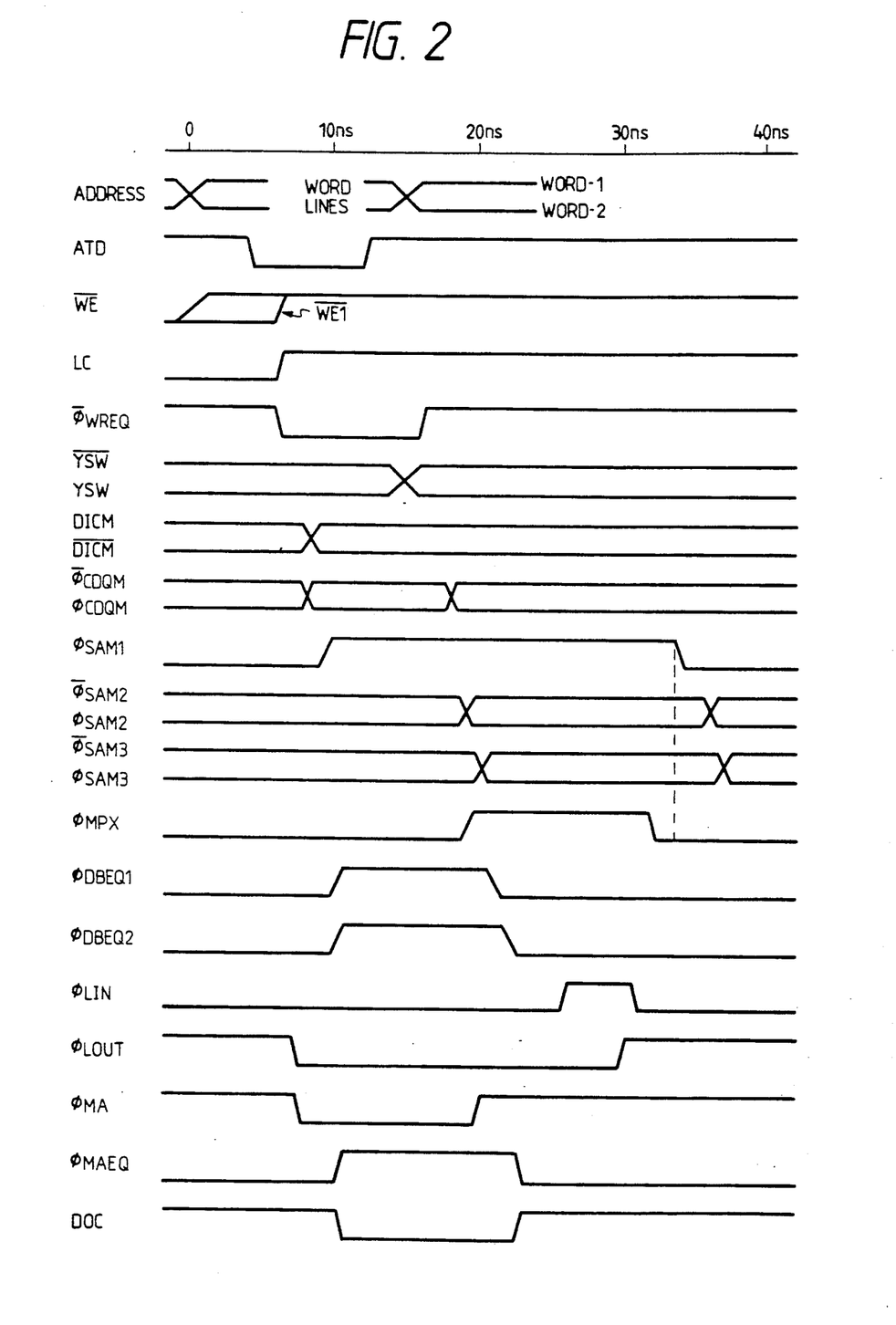
FIGS. 2 and 3 are operating waveform diagrams for explaining the operation of the circuit arrangement of the embodiment in FIGS. 1(A) and 1(B)

Next, in a read cycle, as shown in a timing chart in FIG. 2, the LC signal becomes the "1" level after a $\overline{WE}$ signal has changed from the "0" level to the "1" level. Therefore, the n-channel MOS transistors $Q_3$, $Q_4$ are turned "on". Besides, a pulse signal which holds the "0" level for a predetermined period of time is generated as the signal $\phi_{WREQ}$ by detecting the rise of the $\overline{WE}$ signal, so that the p-channel MOS transistors $Q_6$, $Q_7$, $Q_8$ are turned "on" for the predetermined period of time.

Figure 3:
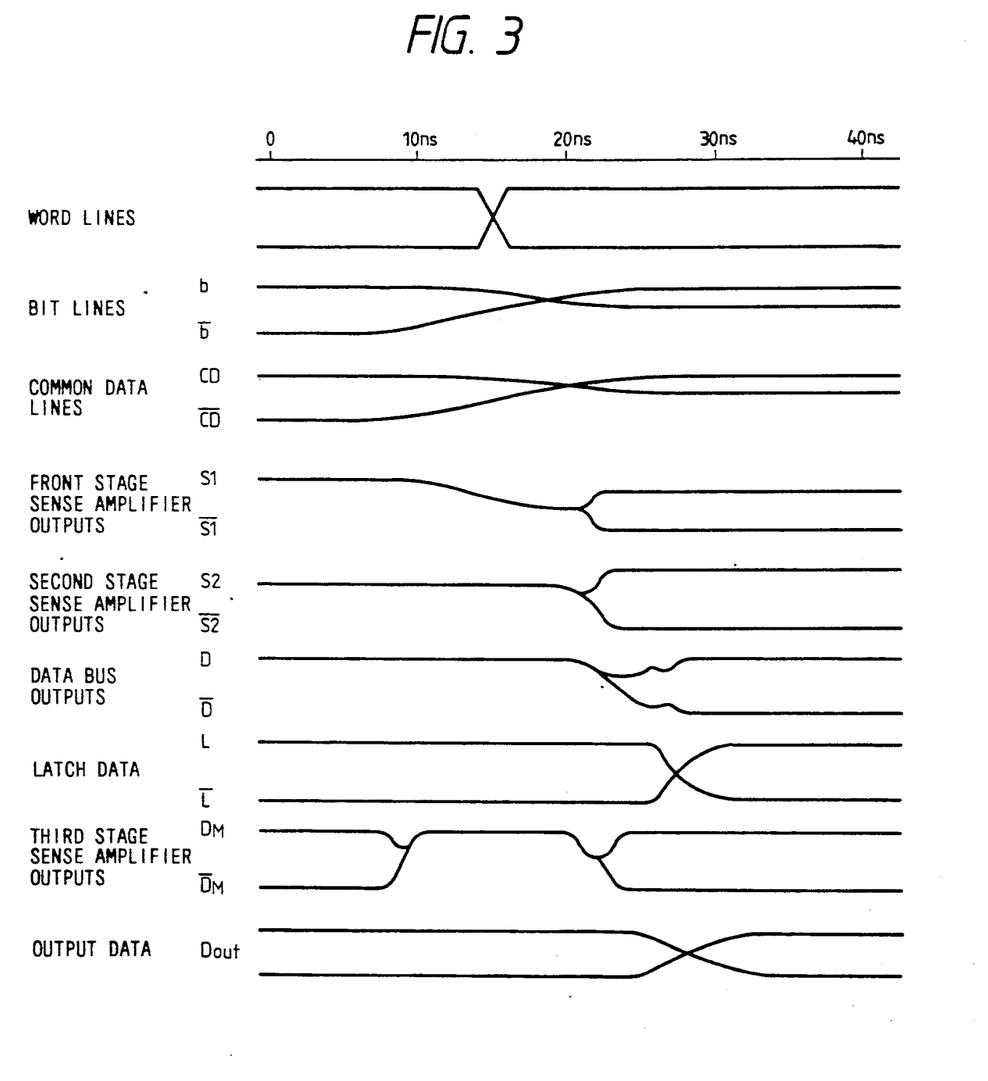

Now, by way of example, there will be supposed a case where, as shown in FIG. 3, the bit line b is at the "1" level with the bit line b̄ being at the "0" level, after information has been written into one memory cell. In this manner, the difference between the potentials of the bit lines b, b̄ is great immediately after the write operation. At the initial stage of the read cycle after the write operation, however, the transistors $Q_4$, $Q_7$ are turned "on". Accordingly, the bit line b̄ is rapidly charged through the transistor $Q_4$ and the transistors $Q_5$, $Q_7$, so that the potential of the bit line b̄ is rapidly raised. Simultaneously, the transistor $Q_8$ is turned "on" thereby to short-circuit the bit lines b, b̄, so that the potentials of the bit lines b, b̄ are equalized more rapidly. In this way, the recovery of the potential levels of the bit lines b, b̄ after the write operation is promptly achieved.

N-channel MOS transistors $Q_9$, $Q_{92}$ are turned "on" by a Y address selection signal Y-SW. When a power source voltage has fluctuated from a high voltage to a low one, these transistors $Q_9$, $Q_{92}$ extract the charges of the bit lines so as to prevent the readout of the memory cell information from delaying.

N-channel MOS transistors $Q_{10}$, $Q_{13}$ and p-channel MOS transistors $Q_{11}$, $Q_{12}$ constitute pass-gates which connect the bit lines b, b̄ and common data lines CD, $\overline{CD}$.

Symbol $Q_{14}$ designates a p-channel MOS transistor, and symbols $Q_{15}$, $Q_{16}$, $Q_{17}$, $Q_{18}$, $Q_{19}$, $Q_{20}$, $Q_{21}$, $Q_{22}$, $Q_{23}$, $Q_{24}$ designate n-channel MOS transistors. In particular, the transistors $Q_{14}$, $Q_{15}$ are equalize MOS transistors for the common data lines CD, $\overline{CD}$, the transistors $Q_{16}$, $Q_{17}$ are MOS transistors which determine the levels of the common data lines, and the transistors $Q_{18}$, $Q_{19}$, $Q_{20}$, $Q_{21}$, $Q_{22}$ are turned "on" by an equalize pulse signal $\phi_{CDQM}$ so as to recover the potential levels of the common data lines after the write operation.

In addition, the n-channel MOS transistors $Q_{23}$, $Q_{24}$ are pass-transistors for writing complementary input signals Di, $\overline{Di}$ into each memory cell.

Symbols $Q_{25}$, $Q_{26}$, $Q_{27}$, $Q_{28}$ denote p-channel load MOS transistors, and symbols $Q_{29}$, $Q_{30}$, $Q_{31}$, $Q_{32}$, $Q_{33}$ denote n-channel differential MOS transistors. These transistors constitute a front stage sense amplifier (a parallel current mirror type amplifier).

The front stage sense amplifier is controlled into an activated condition and amplifies signals at a high gain during a period of time during which a control signal $\phi_{SAM1}$ is at the high level as illustrated in FIG. 2. During any other period of time, the front stage sense amplifier is controlled into a non-activated condition or a low gain—low power consumption operating state.

P-channel MOS transistors $Q_{51}$, $Q_{52}$ function to fix the output levels S1, S1 of the front stage sense amplifier to a $V_{cc}$ level when the front stage sense amplifier has fallen into the non-activated condition. In addition, a p-channel MOS transistor $Q_{34}$ and an n-channel MOS transistor $Q_{35}$ function as equalize transistors for the front stage sense amplifier outputs S1, S1.

Symbols $Q_{36}$, $Q_{37}$ indicate cross-coupled p-channel load MOS transistors, while symbols $Q_{38}$, $Q_{39}$, $Q_{40}$ indicate n-channel differential MOS transistors. These transistors constitute a second stage sense amplifier (a p-channel MOS transistor positive-feedback type amplifier).

Besides, the second stage sense amplifier is controlled into an activated condition and amplifies signals at a high gain during a period of time during which a control signal $\phi_{SAM2}$ is at the high level as illustrated in FIG. 2. During any other period of time, the second stage sense amplifier is controlled into a non-activated condition or a low gain—low power consumption operating state.

Meanwhile, a p-channel MOS transistor $Q_{41}$ and an n-channel MOS transistor $Q_{42}$ are equalize transistors for second stage sense amplifier outputs S2, S2.

In addition, p-channel MOS transistors $Q_{43}$, $Q_{44}$ and n-channel MOS transistors $Q_{45}$, $Q_{46}$ constitute pass-gates which connect the second stage sense amplifier outputs S2, S2 to data buses D, $\overline{D}$. On the other hand, a p-channel MOS transistor $Q_{47}$ and an n-channel MOS transistor $Q_{48}$ are those equalize MOS transistors for the data buses D, $\overline{D}$ which are arranged near the pass-gates $Q_{43}-Q_{46}$.

Figure 1B:
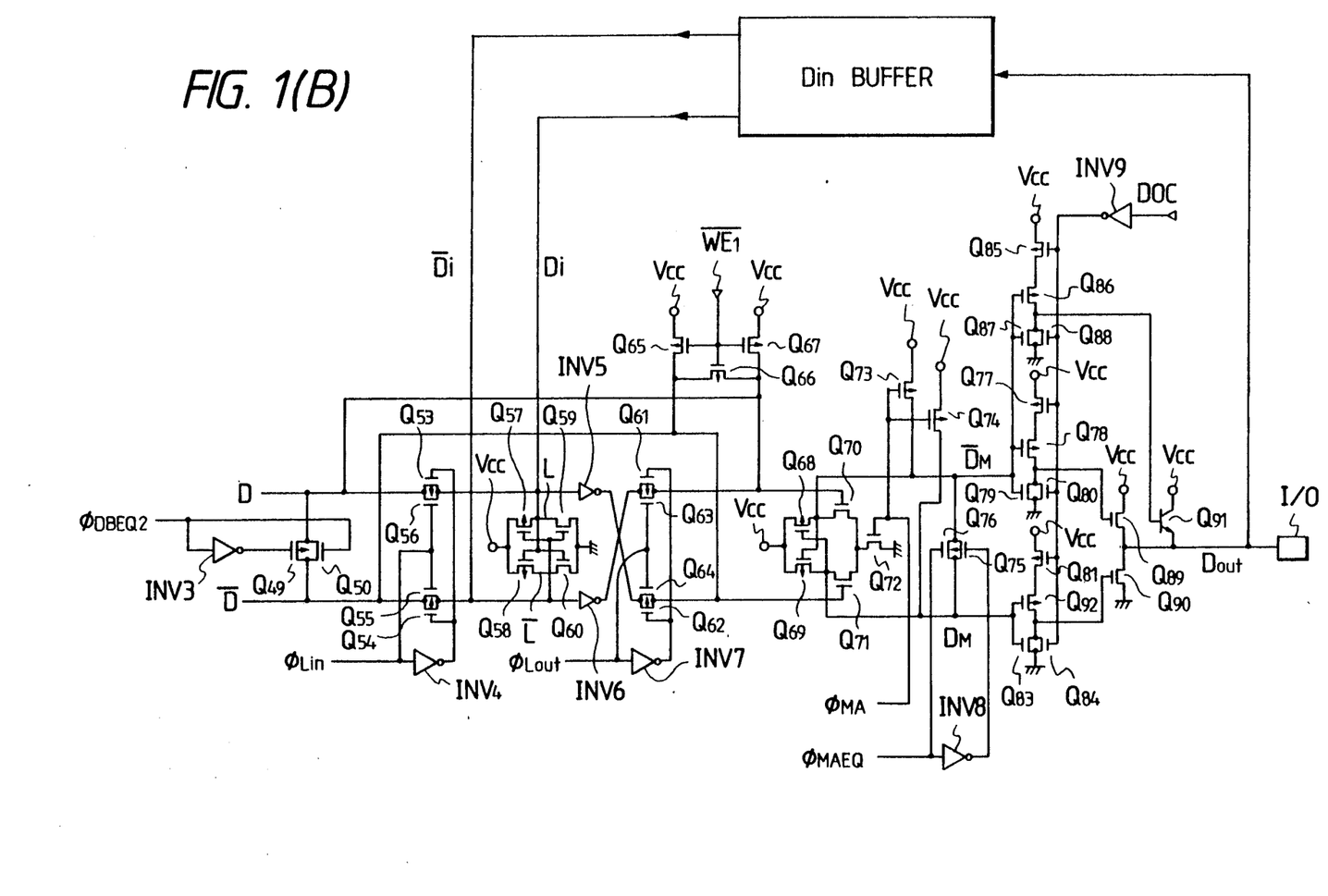

Further, in FIG. 1(B), a p-channel MOS transistor $Q_{49}$ and an n-channel MOS transistor $Q_{50}$ are equalize transistors for the data buses D, $\overline{D}$. In addition, p-channel MOS transistors $Q_{53}$, $Q_{54}$ and n-channel MOS transistors $Q_{55}$, $Q_{56}$ constitute input pass-gates for transmitting signals from the data buses D, $\overline{D}$ to the inputs of a latch circuit.

P-channel MOS transistors $Q_{57}$, $Q_{58}$ and n-channel MOS transistors $Q_{59}$, $Q_{60}$ constitute the latch circuit which serves to store the output data items of the data buses D, $\overline{D}$ after the sense amplifier shown in FIG. 1(A) has fallen into the non-activated condition or the low gain—low power consumption operating state.

P-channel MOS transistors $Q_{61}$, $Q_{62}$ and n-channel MOS transistors $Q_{63}$, $Q_{64}$ constitute pass-gates by which the data items latched in the aforementioned latch circuit are transmitted to the inputs of a succeeding output buffer to be described later. On the other hand, CMOS inverters INV5, INV6 serve to prevent noise etc. from being erroneously written from the output sides of the pass-gates $Q_{61}-Q_{64}$ into the latch circuit. That is, although the CMOS inverters INV5, INV6 are capable of transmitting signals from their inputs to their outputs, they are naturally incapable of transmitting signals in the reverse direction. Accordingly, the noise etc. on the output sides of the pass-gates $Q_{61}-Q_{64}$ are not transmitted to the inputs of the latch circuit $Q_{57}$, $Q_{58}$, $Q_{59}$, $Q_{60}$. On the other hand, p-channel MOS transistors $Q_{65}$, $Q_{66}$, $Q_{67}$ function to equally bring the potential levels of the data buses D, $\overline{D}$ to the potential $V_{cc}$ in the write cycle.

Cross-coupled p-channel load MOS transistors $Q_{68}$, $Q_{69}$, n-channel differential MOS transistors $Q_{70}$, $Q_{71}$, and an n-channel MOS transistor $Q_{72}$ as a constant-current source constitute a third stage sense amplifier (a main amplifier).

The third stage sense amplifier is controlled into an activated condition and amplifies signals at a high gain during a period of time during which a control signal $\phi_{MA}$ is at the high level as illustrated in FIG. 2. During any other period of time, the third stage sense amplifier is controlled into a non-activated condition or a low gain—low power consumption operating state.

Meanwhile, p-channel MOS transistors $Q_{73}$, $Q_{74}$ function to fix the potential levels of sense amplifier outputs $D_M$, $\overline{D_M}$ the $V_{cc}$ level when the third stage sense amplifier has become nonactivated. Besides, a p-channel MOS transistor $Q_{75}$ and an n-channel MOS transistor $Q_{76}$ are equalize transistors for the third stage sense amplifier outputs $D_M$, $\overline{D_M}$. Further, p-channel MOS transistors $Q_{77}$, $Q_{78}$ and n-channel MOS transistors $Q_{79}$, $Q_{80}$ constitute a NOR gate, and they drive the gate of an output transistor (n-channel MOS transistor) $Q_{89}$ for delivering the "1" level as an output. p-channel MOS transistors $Q_{81}$, $Q_{82}$ and n-channel MOS transistors $Q_{83}$, $Q_{84}$ constitute a NOR gate, and they drive the gate of an output transistor (n-channel MOS transistor $Q_{90}$ for delivering the "0" level as an output. p-channel MOS transistors $Q_{85}$, $Q_{86}$ and n-channel MOS transistors $Q_{87}$, $Q_{88}$ constitute a NOR gate, and they drive the base of an N-P-N bipolar transistor $Q_{91}$ for supplying a comparatively great output current at the delivery of the "1" level.

When a control signal DOC has become the high level as shown in FIG. 2, the output of a CMOS inverter INV9 becomes the low level. Accordingly, the p-channel MOS transistors $Q_{77}$, $Q_{81}$, $Q_{85}$ of the three NOR circuits are brought into their conductive states, and the n-channel MOS transistors $Q_{80}$, $Q_{84}$, $Q_{88}$ thereof are brought into their non-conductive states, so that the three output transistors $Q_{89}$, $Q_{90}$, $Q_{91}$ generate a data output Dout conforming to the information read out of the memory cell, at a terminal I/O. During the period of time of the low level of the control signal DOC, the p-channel MOS transistors $Q_{77}$, $Q_{81}$, $Q_{85}$ of the three NOR circuits are held in their non-conductive states, and the n-channel MOS transistors $Q_{80}$, $Q_{84}$, $Q_{88}$ thereof are held in their conductive states, so that the three output transistors $Q_{89}$, $Q_{90}$, $Q_{91}$ are in their non-conductive states. Accordingly, the terminal I/O is in a high impedance state (a floating state).

Meanwhile, in the mode of writing data, the terminal I/O functions as a data input terminal, and a data input buffer (Din buffer) generates the complementary data signals Di, $\overline{Di}$ conforming to the data input signal of the terminal I/O. The complementary data signals Di, $\overline{Di}$ are supplied to the latch circuit and the common data lines CD, $\overline{CD}$.

Circuit Operation of Embodiment

Now, the operations of the sense amplifier circuits and the latch circuit in FIGS. 1(A) and 1(B) for reading out the memory cell information will be described with reference to FIGS. 2 and 3.

Before the potential levels of the two word lines WORD-1, WORD-2 in FIG. 1(A) change-over as illustrated in FIG. 2, the control signal becomes the level of the power source voltage $V_{cc}$. Therefore, the p-channel MOS transistors $Q_{51}$, $Q_{52}$ connected to the output lines S1, S1 of the front stage sense amplifier are brought into their non-conductive states, and the front stage sense amplifier $Q_{25}-Q_{28}$, $Q_{29}-Q_{32}$, and $Q_{33}$ is brought into its activated condition. Accordingly, the potential levels of the front stage sense amplifier outputs S1, S1 having been fixed to the $V_{cc}$ potential lower gradually as illustrated in FIG. 3. On this occasion, the control signal $\phi_{SAM2}$ is still at the GND (ground) level, and a control signal $\overline{\phi_{SAM2}}$ at the $V_{cc}$ level. Therefore, the transistors $Q_{34}$, $Q_{35}$ are turned "on", and the output lines S1, S1 are at the equipotential level.

Subsequently, the potential levels of the common data lines CD, $\overline{CD}$ change-over as shown in FIG. 3 in response to the operation of reading out inverted information items from another memory cell onto the bit lines b, $\overline{b}$. Thereafter, as illustrated in FIG. 2, the control signal $\phi_{SAM2}$ is brought to the $V_{cc}$ potential, and the control signal $\overline{\phi_{SAM2}}$ to the GND potential. Then, output signals produced by amplifying the potential difference between the common data lines CD, $\overline{CD}$ appear as the front stage sense amplifier outputs S1, S1 as illustrated in FIG. 3.

When the control signal $\phi_{SAM2}$ has become the $V_{cc}$ potential as illustrated in FIG. 2, the second stage sense amplifier $Q_{36}-Q_{39}$, $Q_{40}$ is activated. Subsequently, a control signal $\phi_{SAM3}$ becomes the GND potential, and a control signal $\overline{\phi_{SAM3}}$ becomes the $V_{cc}$ potential. Thus, the equalized states of the outputs S2, S2 based on the transistors $Q_{41}$, $Q_{42}$ collapse, and the outputs S2, S2 produced by amplifying the signals S1, S1 are obtained as illustrated in FIG. 3.

In FIG. 1(B), the transistors $Q_{65}$, $Q_{66}$ and $Q_{67}$ have been brought into their conductive states by the signal WE1 of a previous write cycle. Therefore, the data buses D, $\overline{D}$ having been brought to the $V_{cc}$ potential maintain the equipotential levels. When a control signal $\phi_{MPX}$ has become the $V_{cc}$ level as shown in FIG. 2, the pass-gates $Q_{43}$, $Q_{44}$, $Q_{45}$, $Q_{46}$ in FIG. 1(A) are turned "on". Accordingly, the second stage sense amplifier outputs S2, $\overline{S2}$ appear on the data buses D, $\overline{D}$. The transistors $Q_{47}$, $Q_{48}$ in FIG. 1(A) are brought into their conductive states by a pulse signal $\phi_{DBEQ1}$ shown in FIG. 2, and the transistors $Q_{49}$, $Q_{50}$ in FIG. 1(B) are brought into their conductive states by a pulse signal $\phi_{DEBEQ2}$ shown in FIG. 2, so that the data buses D, $\overline{D}$ are short-circuited. Accordingly, the data buses D, $\overline{D}$ are held at the same potential. Immediately after the pass-gates $Q_{43}$–$Q_{46}$ in FIG. 1(A) have been turned "on", the control signals $\phi_{DBEQ1}$, $\phi_{DBEQ2}$ become the low level, whereby the short-circuiting MOS transistors $Q_{47}$–$Q_{50}$ are brought into their non-conductive states. Thus, the signals of the second sense amplifier outputs S2, $\overline{S2}$ with the level difference increased can be transmitted to the data buses D, $\overline{D}$.

As illustrated in FIG. 1(B), the signals transmitted to the data buses D, $\overline{D}$ are transmitted to the inputs of the third stage sense amplifier $Q_{68}$–$Q_{70}$, $Q_{71}$ through the paths laid so as to circumvent the latch circuit $Q_{57}$–$Q_{60}$, without passing this latch circuit.

Before the transmission of the signals to the inputs of the third stage sense amplifier, the control signal $\phi_{MA}$ is held at the GND potential as shown in FIG. 2, whereby the third stage sense amplifier $Q_{68}$–$Q_{70}$, $Q_{71}$ is in its non-activated condition. Moreover, the transistors $Q_{73}$, $Q_{74}$ are in their conductive states. Therefore, the outputs $D_M$, $\overline{D_M}$ of the third stage sense amplifier are fixed to the $V_{cc}$ potential. Since, on this occasion, a control signal $\phi_{MAEQ}$ is at the $V_{cc}$ potential as shown in FIG. 2, the transistors $Q_{75}$, $Q_{76}$ are turned "on" to set the outputs $D_M$, $\overline{D_M}$ at the same potential. Immediately before the data bus signals reach the third stage sense amplifier, the control signal $\phi_{MA}$ is brought to the $V_{cc}$ potential as shown in FIG. 2, so that the third stage sense amplifier is activated. In addition, the transistors $Q_{73}$, $Q_{74}$ are turned "off" by the control signal $\phi_{MA}$, and the potential of the output levels $D_M$, $\overline{D_M}$ comes to lower. Subsequently, immediately after the data bus signals have reached the third stage sense amplifier, the control signal $\phi_{MAEQ}$ is set at the GND potential as shown in FIG. 2. Accordingly, the transistors $Q_{75}$, $Q_{76}$ are turned "off", so that signals amplified by the third stage sense amplifier appear at the outputs $D_M$, $\overline{D_M}$. Since, on this occasion, the control signal DOC is at the $V_{cc}$ potential as shown in FIG. 2, the output buffer generates the data output Dout conforming to the outputs $D_M$, $\overline{D_M}$, as illustrated in FIG. 3.

Thereafter, in the circuit arrangement of FIG. 1(B), a control signal $\phi_{LiN}$ is set at the $V_{cc}$ potential as shown in FIG. 2, and the pass-gates $Q_{53}$–$Q_{56}$ are turned "on", so that the signals of the data buses D, $\overline{D}$ are stored in the latch circuit constructed of the transistors $Q_{57}$–$Q_{60}$. On this occasion, the potential difference between the data buses D, $\overline{D}$ decreases for a moment. The decrease in the potential difference, however, hardly affects the delay of an access time because the outputs $D_M$, $\overline{D_M}$ of the third stage sense amplifier and the data output Dout of the output buffer have already been settled. Subsequently, a control signal $\phi_{LouT}$ is set at the $V_{cc}$ potential as shown in FIG. 2. Therefore, the potential levels of the third stage sense amplifier outputs $D_M$, $\overline{D_M}$ and the output buffer data output Dout are maintained by the data items stored in the latch circuit through the CMOS inverters INV5, INV6. As soon as the data items have been stored in the latch circuit, the control signal $\phi_{LiN}$ is set at the GND potential as shown in FIG. 2, and the input side pass-gates $Q_{53}$–$Q_{56}$ are disabled, so that noise is prevented from being erroneously written into the latch circuit. The CMOS inverters INV5, INV6 function to prevent the noise of the data buses D, $\overline{D}$ attributed to the output side pass-gates $Q_{61}$–$Q_{64}$ from being erroneosuly written into the latch circuit while these output side pass-gates are enabled.

According to the present invention, it hardly affects the delay of an access time to store data bus signals in a latch, so that a high-speed access can be realized.

According to a preferred aspect of performance of the present invention, that recovery of the potential of a low potential bit line immediately after a write cycle which has become more difficult in an SRAM of large capacity and high integration density is effected rapidly, and a very short access time can be realized.

What is claimed is:

1. A semiconductor integrated circuit device comprising:
   a plurality of memory cells;
   a first sense amplifier which amplifies complementary signals read out from a selected one of said plurality of memory cells and provides at complementary outputs thereof complementary output signals;
   a latch circuit which has complementary signal lines for receiving data of said complementary output signals from said first sense amplifier and stores said data therein;
   a circuit having complementary inputs coupled to receive the data on said complementary signals of said latch circuit, said circuit including a second sense amplifier and an output buffer, said second sense amplifier having complementary inputs connected to the complementary inputs of said circuit, said output buffer having complementary inputs connected to complementary outputs of said second sense amplifier, and said output buffer outputting an output signal from an output terminal thereof;
   first pass-gates which are connected between the complementary outputs of said first sense amplifier and the complementary signal lines of said latch circuit;
   second pass-gates which are connected between the complementary signal lines of said latch circuit and the complementary inputs of said circuit; and
   signal paths which directly transmit the complementary output signals from said first sense amplifier to the complementary inputs of said circuit and which bypass said first pass-gates, said latch circuit and said second pass-gates,
   wherein said signal paths effect a direct connection, without any intervening elements, from the complementary outputs of said first sense amplifier to the complementary inputs of said second sense amplifier, and
   wherein the complementary output signals of said first sense amplifier are at first directly transmitted to the complementary inputs of said circuit through said signal paths, whereby said output buffer generates the output signal in response to the complementary output signals of said first sense amplifier, as transmitted to said circuit from said signal paths, and thereafter said first pass-gates and said second pass-gates are respectively brought into a signal-through condition, and said first sense amplifier is controllably brought to a non-activated condition or to a low gain-low power consumption operating state.

2. A semiconductor integrated circuit device according to claim 1,
wherein after said first pass-gates and said second pass-gates have each been brought into the signal-through condition, said first pass-gates are are controllably brought to a signal-non-through condition.

3. A semiconductor integrated circuit devices according to claim 2,
wherein said latch circuit includes a positive feedback circuit comprised of a pair of inverters in which are input/output of one is cross-coupled with the output/input of the other one thereof, respectively; and
wherein inputs and outputs of unidirectional signal transmission circuits are respectively connected to the complementary signal lines of said latch circuit and said second path-gates.

4. A semiconductor integrated circuit device according to claim 3,
wherein the pair of inverters of said latch circuit and said unidirectional signal transmission circuits are CMOS inverters.

5. A semiconductor integrated circuit device according to claim 4, wherein said first sense amplifier comprises:
differential transistors which respond to complementary input signals received at inputs of said first sense amplifier;
first and second load MOS transistors which are connected to differential outputs of said differential transistors, and those gates and drains are cross-coupled; and
first switching means connected between the differential outputs of said differential transistors, and controlled by a first control signal.

6. A semiconductor integrated circuit device according to claim 1,
wherein said plurality of memory cells are connected to a pair of bit lines; and
wherein a source-drain path of an equalizing MOS transistors is connected to said pair of bit lines, and a pulse signal of a predetermined duration generated in response to an end of a write signal is supplied to a gate of said equalizing MOS transistor, thereby to hold said equalizing MOS transistor in its conductive state for said predetermined duration.

7. A semiconductor integrated circuit device according to claim 6
wherein after said first pass-gates and said second pass-gates have each been brought into the signal-through condition, said first pass-gates are controllably brought to a signal-non-through condition.

8. A semiconductor integrated circuit device according to claim 7,
wherein said latch circuit includes a positive feedback circuit comprised of a pair of inverters in which an input/output of one is cross-coupled with the output/input of the other one thereof, respectively; and
wherein inputs and outputs of unidirectional signal transmission circuits are respectively connected to said complementary signal lines of said latch circuit and said second path-gates.

9. A semiconductor integrated circuit device according to claim 8,
wherein the pair of inverters of said latch circuit and said unidirectional signal transmission circuits are CMOS inverters.

10. A semiconductor integrated circuit device according to claim 9, wherein said first sense amplifier comprises:
differential transistors which respond to complementary input signals received at inputs of said first sense amplifier;
first and second load MOS transistors which are connected to differential outputs of said differential transistors, and whose gates and drains are cross-coupled; and
first switching means connected between the differential outputs of said differential transistors, and controlled by a first control signal.

* * * * *